United States Patent [19]
Wikle et al.

[11] Patent Number: 5,610,832
[45] Date of Patent: Mar. 11, 1997

[54] INTEGRATED CIRCUIT DESIGN APPARATUS WITH MULTIPLE CONNECTION MODES

[75] Inventors: Glenn Wikle, South Orange; Suresh Ramaswamy, Flanders; Thomas G. Matheson, Brookside, all of N.J.

[73] Assignee: Mentor Graphics Corporation, Wilsonville, Oreg.

[21] Appl. No.: 343,757

[22] Filed: Nov. 22, 1994

[51] Int. Cl.6 .................................................... G06F 15/60
[52] U.S. Cl. .......................... 364/491; 364/488; 364/489; 364/490
[58] Field of Search ..................................... 364/491, 490, 364/499, 488

[56] References Cited

U.S. PATENT DOCUMENTS 5,247,456  9/1993  Ohe et al. ................................ 364/491

OTHER PUBLICATIONS

*Physical Design Automation of VLSI Systems*, Bryan Preas and Michael Lorenzetti, Ch. 6, pp. 211–281, The Benjamin/Cummings Publishing Company, Inc., 1988.
*L Database and Language User's and Reference Manual*, v 5.6_1, 1985.
I. Rugen et al., "An Interactive Layout Design System with Real–Time Logical Verification and Extraction of Layout Parasitica" Jun. 1988, IEEE Journal of Solid State Circuits, 698–704.

*Primary Examiner*—Kevin J. Teska
*Assistant Examiner*—Andrew Roberts
*Attorney, Agent, or Firm*—Klarquist Sparkman Campbell Leigh & Whinston, LLP

[57] ABSTRACT

Method and apparatus for providing multiple connection modes in a CAD tool or other computer program for integrated circuit design. The apparatus includes a graphical editor for entering and modifying, in memory, circuit elements of an integrated circuit layout. Within the apparatus is an implicit connection generator for automatically extracting electrical connections between the circuit elements in the layout, the generator representing the connections by connectivity data stored in a design database contained within memory. Also within the apparatus is an explicit wiring generator for creating and preserving electrical connections between the circuit elements in response to user commands from the editor. The explicit wiring generator represents the connections by connectivity data stored in the design database. The connectivity data has the same format whether generated by the implicit connection or explicit wiring generators, and thus can be modified by either connection mode of operation regardless of how the data was originally created.

13 Claims, 8 Drawing Sheets

FIG. 6A

POINTED TO BY PORT INSTANCE DATA STRUCTURES (FIG. 6B)

ELEMENT W0  — 74

| NAME | W0 |
|---|---|
| ATTRIBUTE COUNT | 1 |
| ATTRIBUTE ARRAY | 0: P / SHAPE / POLY / PORT |

POINTED TO BY PORT INSTANCE DATA STRUCTURES (FIG. 6B)

ELEMENT T0  — 72

| NAME | T0 | | | | |
|---|---|---|---|---|---|
| ATTRIBUTE COUNT | 5 | | | | |
| ATTRIBUTE ARRAY | 0: P3 | 1: P4 | 2: GATE | 3: P1 | 4: P2 |
| | SHAPE | SHAPE | SHAPE | SHAPE | SHAPE |
| | DIFFUSION | DIFFUSION | POLY | POLY | POLY |
| | PORT | PORT | GEOMETRY | PORT | PORT |

INTEGRATED CIRCUIT DESIGN APPARATUS WITH MULTIPLE CONNECTION MODES

FIELD OF THE INVENTION

This invention relates to computer-based design automation of electrical circuits. More particularly, the invention relates to an integrated circuit design apparatus and method with multiple connection modes for creating an electrical circuit model of an integrated circuit layout.

BACKGROUND OF THE INVENTION

Integrated circuits (ICs) are designed today with computers using a computer program known as an integrated circuit design tool or editor. With this tool, a circuit designer enters symbolic or geometrical shapes representing elements of an integrated circuit design into a computer and manipulates the size and location of the elements to produce a simulated layout of the circuit. The geometrical shapes correspond to circuit elements, or components, such as transistors, resistors and capacitors and appear on a computer display screen. These shapes represent a physical layer of material in an integrated circuit such as metal, silicon doped with impurities, or polysilicon layers, with each material typically shown in a different color. From this simulated layout, the design tool generates data for producing photolithographic masks that are then used for fabricating the integrated circuit.

An important aspect of integrated circuit layout design is creating an electrical model of the integrated circuit being designed. The electrical model describes connections between circuit elements of the design. The model is used for a number of purposes, including checking whether the circuit design meets desired design rules, determining whether the design can be compacted and for simulating the circuit's operation. The circuit model is typically represented as a netlist, which is a list of the circuit elements and their connections. For example, a circuit model for a MOSFET transistor circuit is represented as a list of connections between the source, drain and gate elements of the transistor.

Integrated circuit layout tools have typically derived circuit models from circuit layouts in one of a number of ways. One way is known as the "implicit" circuit extraction, or connection, mode. In this mode, the circuit model is automatically and continuously extracted from the design as circuit elements are added and overlapped or abutted on screen. The electrical circuit connectivity is extracted using a set of electrical design rules which describe which mask layers can carry electrical current and which sets of two mask layers pass current from one layer to another. These mask layer conductivity rules are used in conjunction with geometric intersection routines to extract the electrical circuit model from the set of mask geometries in the layout.

The implicit connection mode works continuously to update the circuit model to reflect present connections between the circuit elements of the layout. Thus an initial connection between two elements produced by an overlap of their geometrical shapes is broken if the two elements are moved sufficiently apart from each other. This is a drawback where it is desirable to preserve circuit connections even if the elements are moved apart. For example, circuit layout tools often allow designers to write programs that use the tool to optimize circuit layouts, such as for compacting the area of the circuit. In using the tool and program, the designer enters an initial design that includes electrical connections. These connections are to be preserved as the program rearranges the shapes corresponding to the circuit elements to reduce the area of the initial design. With the implicit connection mode, however, electrical connections are lost if the geometrical shapes are moved sufficiently apart from each other so that they no longer overlap.

An alternative connection mode that preserves the electrical connections is known as the "explicit" wiring mode. In this mode, a user manually enters the electrical connections between circuit elements. None is extracted from the circuit design. But unlike the implicit mode, the connections between elements are preserved if overlapping geometrical shapes of different elements are pulled apart. A conductive wire is added when the connection is initially established, and the wire stretches or shrinks to accommodate the movement of a circuit element. With the explicit wiring mode, a user can connect geometrical shapes and then run a program that optimizes the placement of geometrical shapes because the connections are maintained. However, a drawback of the explicit wiring mode is the need to manually connect the circuit elements. For integrated circuits of repetitive design such as a memories or for complex circuits with numerous connections, the task of manual connecting the elements can be quite onerous.

Prior integrated circuit layout tools have been limited to one or the other connection modes because the electrical connectivity data in each mode is stored in a different format. Mixing the two modes has not been practical. Connectivity data from the implicit connection mode cannot be easily modified by the explicit wiring mode and vice versa.

Accordingly, an object of the invention is to provide an integrated circuit design apparatus with multiple connection modes available to a user. Still another object of the invention is to provide such an apparatus in which the connectivity data from explicit and implicit connection modes is stored in the same format in a single database. Yet another object of the invention is to provide such an apparatus in which connectivity data from both connection modes is stored in a format that permits the data to be updated with either mode if the electrical connections are further modified.

SUMMARY OF THE INVENTION

In accordance with the invention, method and apparatus for providing multiple connection modes for integrated circuit design are disclosed. The apparatus includes an editing means for entering and modifying, in memory, circuit elements of an integrated circuit layout. Within the apparatus is an implicit connection generator for automatically extracting electrical connections between the circuit elements in the layout, the generator representing the connections by connectivity data stored in a design database contained within memory. Also within the apparatus is an explicit wire generator for creating wires and electrical connections between the circuit elements in response to user commands from the editing means, the explicit wire generator also representing the connections by connectivity data stored in the design database. The connectivity data preferably has the same format whether generated by the implicit or explicit generator, and thus the data can be modified by either mode of operation regardless of how the data was originally created.

BRIEF DESCRIPTION OF THE DRAWINGS

FIGS. 6A–C show data structures within the apparatus for storing the connectivity, net and element data of an integrated circuit.

DETAILED DESCRIPTION OF A PREFERRED EMBODIMENT

Figure 1:
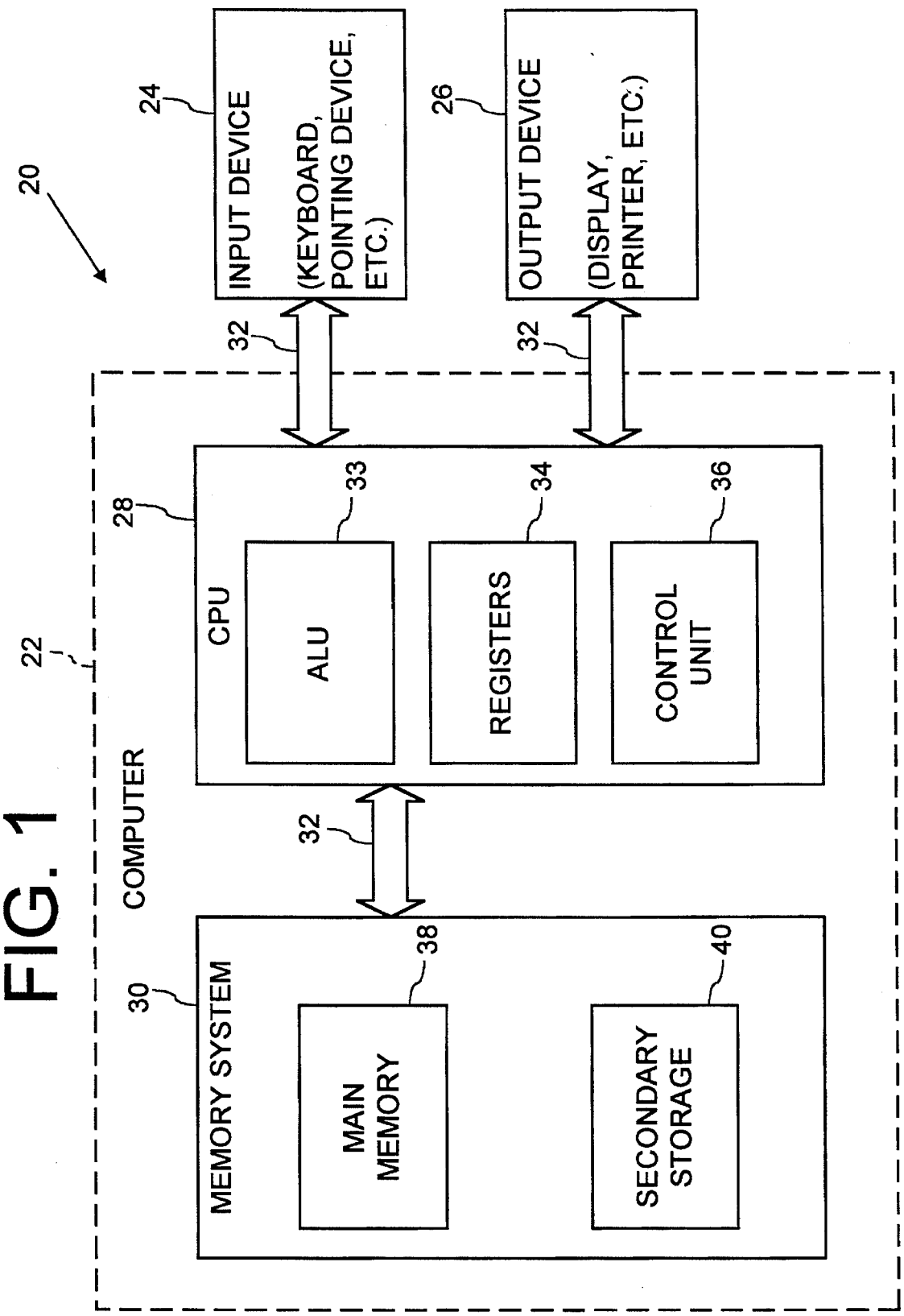
FIG. 1 is a block diagram of a computer system that may be used to implement a method and apparatus embodying the invention.

FIG. 1 is a block diagram of a computer system 20 which is used to implement an integrated circuit design method and apparatus embodying the invention. Computer system 20 includes as its basic elements a computer 22, input device 24 and output device 26.

Computer 22 generally includes a central processing unit (CPU) 28 and a memory system 30 that communicate through a bus structure 32. CPU 28 includes an arithmetic logic unit (ALU) 33 for performing computations, registers 34 for temporary storage of data and instructions and a control unit 36 for controlling the operation of computer system 20 in response to instructions from a computer program such as an application or an operating system.

Memory system 30 generally includes high-speed main memory 38 in the form of a medium such as random access memory (RAM) and read only memory (ROM) semiconductor devices and secondary storage 40 in the form of a medium such as floppy disks, hard disks, tape, CD-ROM, etc. and other devices that use optical or magnetic recording material. Main memory 38 stores programs such as a computer's operating system and currently running application programs. Main memory 38 also includes video display memory for displaying images through a display output device 26.

Input device 24 and output device 26 are typically peripheral devices connected by bus structure 32 to computer 22. Input device 24 may be a keyboard, modem, pointing device, pen, or other device for providing input data to the computer. Output device 26 may be a display device, printer, modem, sound device or other device for providing output data from the computer. The input and output devices may be physically combined into a single device if desired.

It should be understood that FIG. 1 is a block diagram illustrating the basic elements of a computer system 20; the figure is not intended to illustrate a specific architecture for a computer system 20. For example, no particular bus structure is shown because various bus structures known in the field of computer design may be used to interconnect the elements of the computer system in a number of ways, as desired. CPU 28 may be comprised of a discrete ALU 33, registers 34 and control unit 36 or may be a single device in which these parts of the CPU are integrated together, such as in a microprocessor. Moreover, the number and arrangement of the elements of the computer system may be varied from what is shown and described in ways known in the art (i.e., multiple CPUs, client-server systems, computer networking, etc.).

Figure 2:
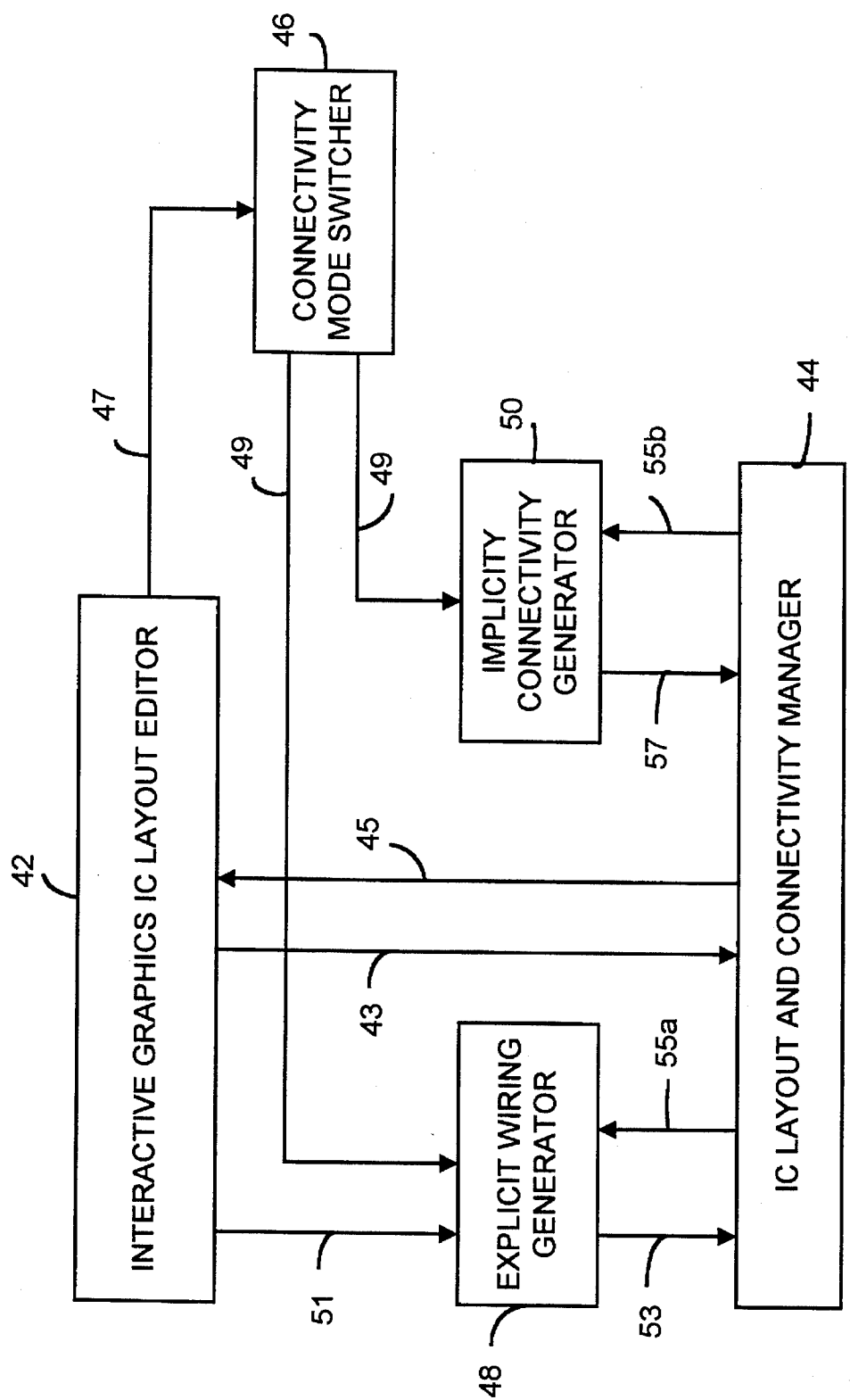
FIG. 2 is a data flow diagram of an integrated circuit design apparatus embodying the invention.

FIG. 2 is a data flow diagram of an integrated circuit design apparatus 41 embodying the invention. In the present embodiment, the apparatus 41 is implemented with a computer program executing on computer system 20, and the parts of the apparatus are implemented in modules of code. It will be understood by those of skill in the art, of course, that apparatus 41 could also be implemented in other ways, such as in an equivalent hardware device. To aid in understanding the diagram, the information flowing among the various parts of the design apparatus 41 is indicated by numbered arrows, which are referred to in the following description.

Shown within FIG. 2 is a conventional interactive graphics IC layout editor 42 with which a user edits an IC layout. The editor 42, which is operable via a keyboard, mouse or other input device 24, allows a user to select circuit elements from a menu on the screen of a display device 26 and to add, move, modify and otherwise arrange the selected elements to create an integrated circuit. The graphics editor, of course, is but one of many ways to enter commands and circuit elements into apparatus 41. Other ways include text commands, programs, etc. well known in the art. For the purpose of this description, all of these techniques are represented by editor 42. These editor requests concerning circuit elements are communicated from the graphics editor to a database manager 44 for storage as part of a circuit design in a design database (FIG. 3), as indicated by arrow 43. Database manager 44, in turn, requests that the editor display the circuit elements on screen as they are selected or modified (arrow 45).

Apparatus 41 permits electrical connections between circuit elements selected for the integrated circuit to be made in two ways: through an implicit connection mode or an explicit wiring connection mode. In the explicit mode, the user signals the apparatus that a wire connection is to be made between two elements displayed on screen, such as between the gates of two transistors. This signalling may be done graphically with a pointing device or textually with a command. In response, apparatus 41 makes the connection and indicates the connection with a wire between the connected circuit elements. An electrical connection made in the explicit wiring mode is preserved if the connected circuit elements are then moved from their original locations. The wire shrinks, stretches or bends to maintain the connection.

In the implicit connection mode, electrical connections are made automatically by apparatus 41 wherever conductive elements displayed on display device 26 overlap in the layout. For example, if a wire element is placed to overlap a gate of a transistor, an electrical connection is automatically made. However, electrical connections made in the implicit connection mode are not preserved if the two circuit elements are later moved so that they do not overlap. The connection is simply broken.

As shown in FIG. 2, a user may select between these two modes by using the graphics editor 42 to signal the selection to a connectivity mode switcher 46 (arrow 47). The mode switcher 46, in turn, communicates with an explicit wiring generator 48 and an implicit connection generator 50, controlling their operation through requests to enable or disable each generator (arrows 49). The explicit wiring generator 48 provides the explicit wiring mode of operation, and the implicit connection generator provides the implicit connectivity mode of operation. For example, if the user desires to use the explicit wiring mode, he makes a request through the graphics editor 42. The request is communicated to the connectivity mode switcher 46, which then enables the explicit wiring generator 48 and disables the implicit connection generator 50.

The explicit wiring generator 48 also communicates with the graphics editor 42 and the database manager 44. From the graphics editor, the explicit wiring generator receives user-initiated requests to add connecting wires to a circuit under design (arrow 51). The explicit wiring generator 48 in response sends requests to the database manager 44 (arrow 53). These requests are to add typed connections between ports of circuit elements, such as adding a wire between a port of one transistor and the port of another, and to change the shape of wires in response to movement of a circuit element. A typed connection includes information as to the type of connection—whether the connection is between a port and the head of a wire, a port and the tail of a wire, or a port and another port such as the midpoint of a wire. As will be seen, the type of electrical connection between two elements indicates how the wire reacts if the circuit elements connected to it are moved. From the database manager 44, the explicit wiring generator 48 receives notification of element additions, movement and size changes (arrow 55a) made by the graphics editor. In response to a wire movement or element size change, the explicit wiring generator causes a wire to be added or moved to preserve the electrical connection (arrow 53). This request is translated by the database manager 44 into a request to editor 42 to change the appearance of the layout on screen to reflect the change made by the explicit wiring generator.

The implicit connection generator communicates with the database manager 44 to request the addition or removal of typed connections based upon physical (i.e., extracted) connectivity data of the circuit design (arrow 57). Like the explicit wiring generator, the implicit connection generator receives notification from the database manager of element addition, movement and size changes (arrow 55b) and uses that information to request the addition or removal of typed connections. As will be explained, by using typed connections with the implicit connection generator, modifications in the explicit wiring mode may successfully be made to an electrical connection created made in the implicit connection mode.

Figure 3:
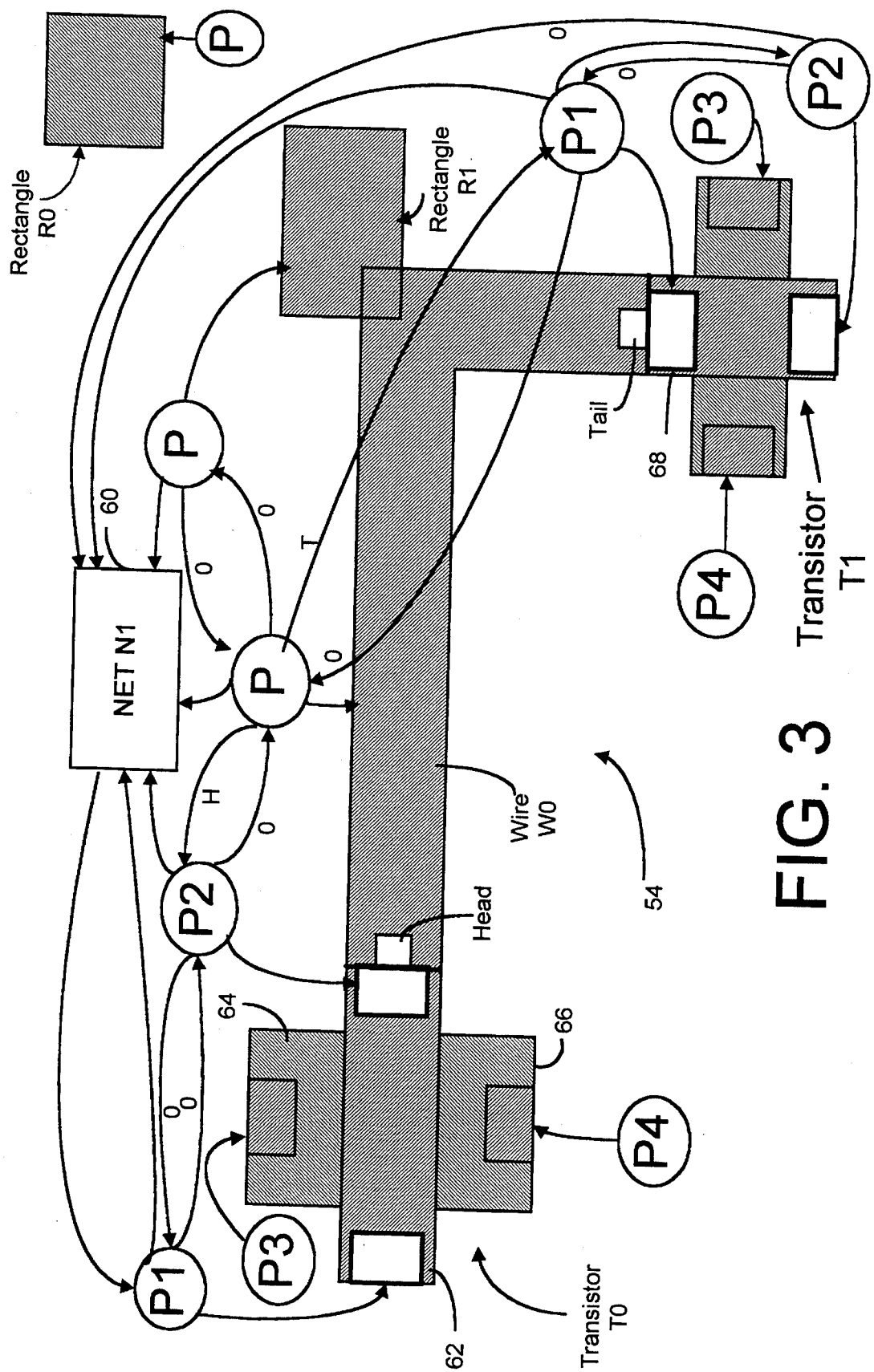
FIG. 3 is a visual representation of a circuit design database for representing a circuit model and mask geometries of an integrated circuit.

FIG. 3 is a visual representation of connectivity and layout data stored within a design database 54 that represents a circuit model and mask geometries of an example integrated circuit. The database 54 is accessed by the database manager 44 through normal database operations (add, modify, delete, query, etc.). The circuit model (the circuit elements and their electrical connections) is represented by a net N1. The net, or netlist, is comprised of connected ports P, P1, P2 of the elements in the circuit model. A port is a connection point of a circuit element. As will be described, associated in the database 54 with each port is a data structure that describes the port's type of electrical connections. Also stored in the design database are element data structures that contain the mask geometries for the circuit elements of the design. The masks are represented in FIG. 3 by the illustrated geometric shapes of the circuit elements.

Referring now to FIGS. 2 and 3, when an electrical connection between circuit elements is made in either connection mode, an explicit connection is established in the database between the circuit elements. The explicit connection may be one of three types—head, tail, or other—and depends on what type and what part of circuit elements were connected. Head and tail type connections indicate that a head or tail end of an expandable wire element is connected to another circuit element. A connection of type other indicates an other type of connection was made, such as between the port of a transistor gate and the middle of a wire element. For example, in FIG. 3, a transistor T0 includes a gate 62, a drain 64 and a source 66. None of these circuit elements is an expandable wire element, so the elements' ports (P1, P2, P3, P4) form other types of connections when electrically connected to another port. The gate 62 connecting ports P1 and P2 is conductive and therefore the connection between these two ports is designated other. On the other hand, the electrical connection between port P of wire element W0 and port P2 of gate 62 is a head type connection since the electrical connection occurs at the head end of the wire. Similarly, the electrical connection at the tail end of wire W0 and port P1 of gate 68 of transistor T1 is a tail type connection. And the electrical connection between the port P of rectangle R1 and an edge of wire W0 (port P) is an other connection since it does not take place at the head or tail of a wire element. The heavy black lines indicate the borders of the various ports of the circuit elements. For example, the contacts of gate 62 are outlined in black, and the entire edge of wire W0 is outlined in black.

Figure 4:
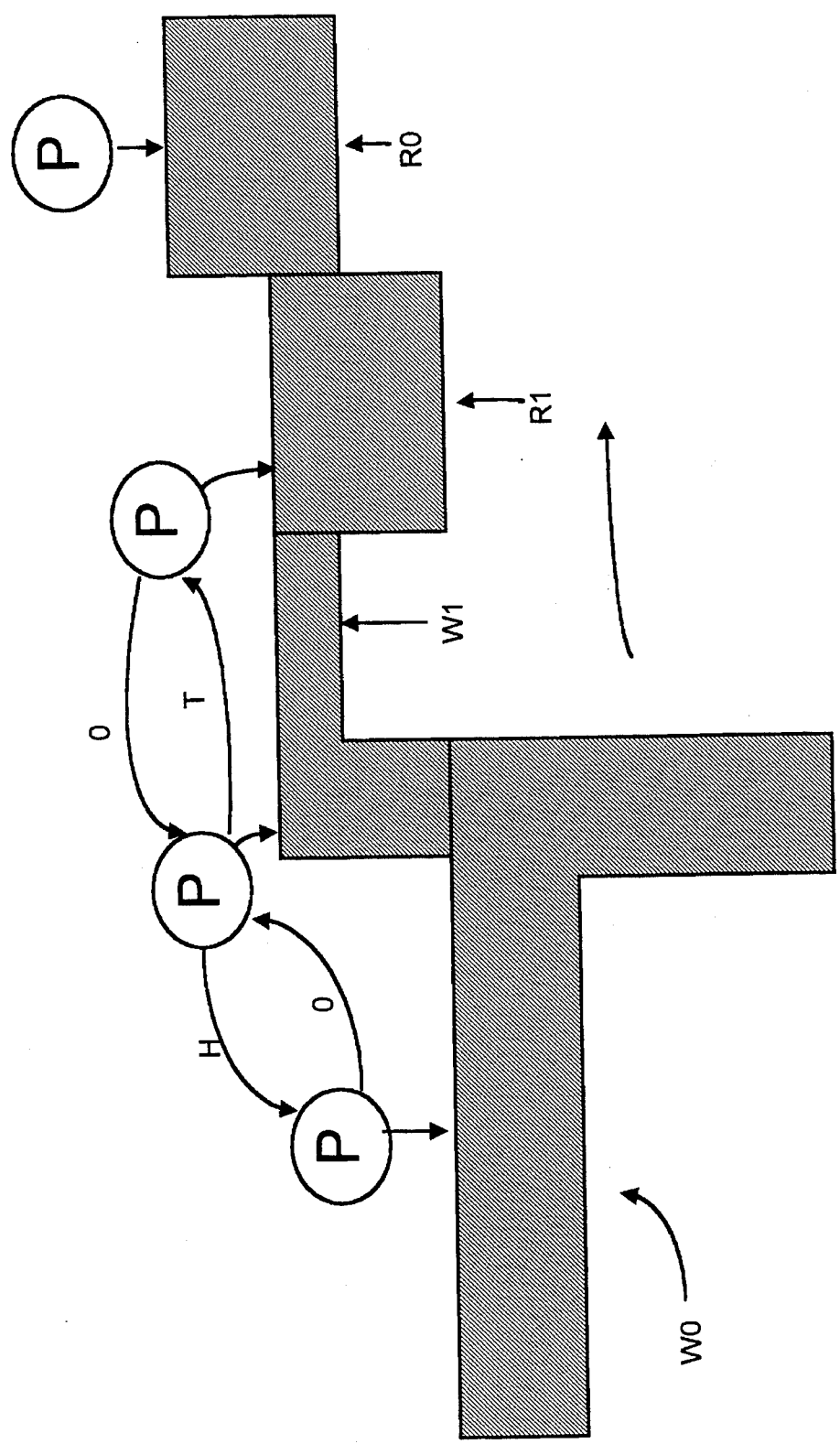
FIG. 4 is a visual representation of how the apparatus responds to editing of a circuit layout in an explicit wiring mode.

The type of electrical connection between two elements controls the response of the design apparatus to movement or modification of the circuit elements. If the user is editing the circuit design in explicit wiring mode, head or tail type connections are preserved by shrinking, expanding or otherwise moving an existing wire to maintain contact between two ports. Other connections are preserved in explicit wiring mode by adding a wire or wire segment between the two ports. FIG. 4 illustrates this response. While in the explicit wiring mode, the user has moved conductive element R1 apart from wire W0 and into electrical contact with conductive element R0 (as indicated by the large arrow). The apparatus 41 responds by creating a new wire W1 between wire element W0 and element R1 (but does not automatically create a new other connection between elements R1 and R0 since the editor is in the explicit mode). Wire W1 is connected at its head to wire W0 and at its tail to element R1. Wire W0 was not stretched to preserve the original connection since neither its head or tail was connected to element R1. However, wire W1 will stretch if either wire W0 or element R1 is moved since the connections to these two elements are head and tail, respectively.

Figure 5:
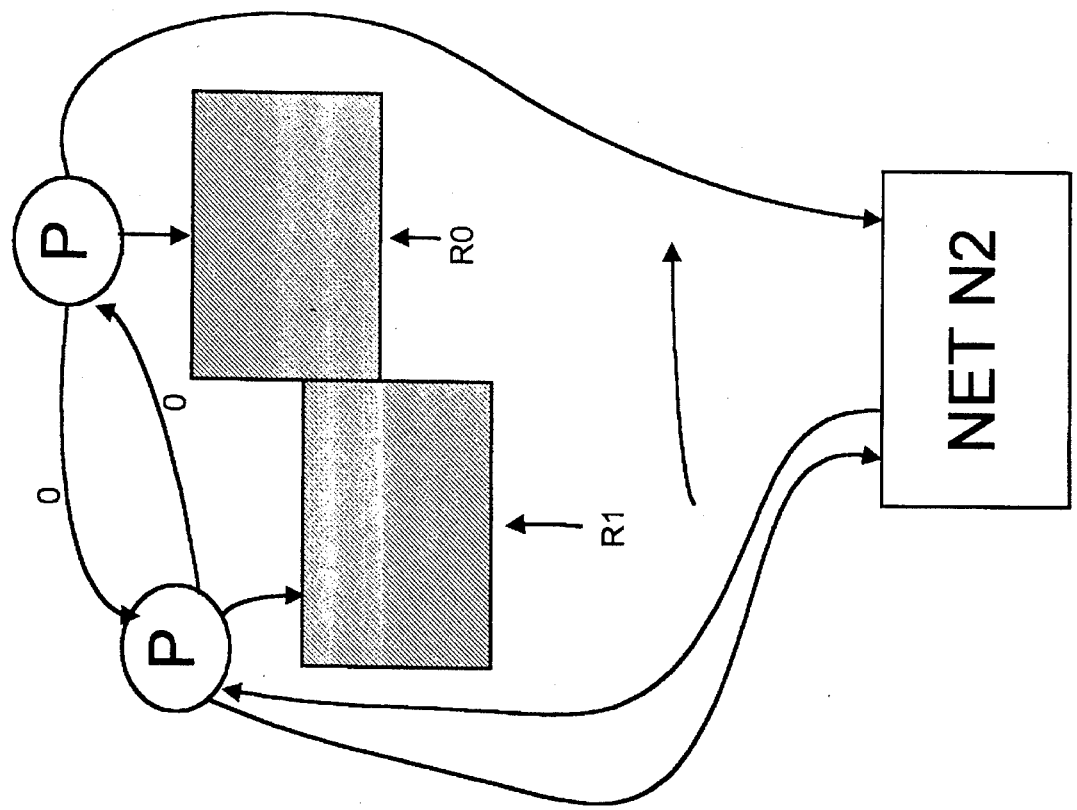
FIG. 5 is a visual representation of how the apparatus responds to editing of a circuit layout in an implicit connection mode.
Figure 5:
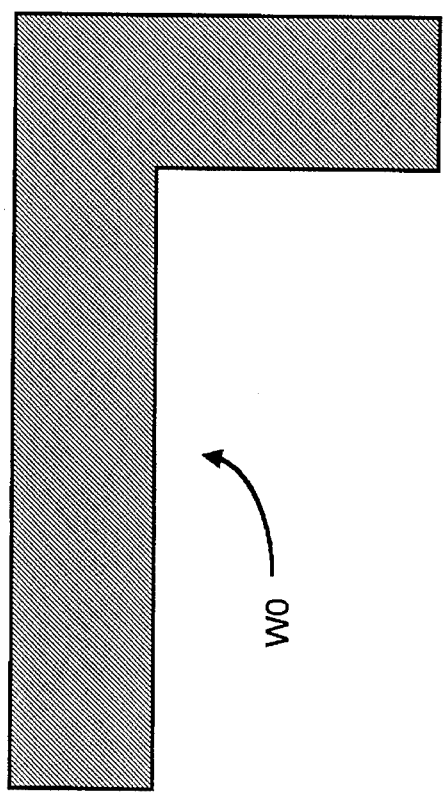

The response of the design apparatus 41 to modification of the circuit model in the implicit connection mode is to add or remove typed connections rather than to stretch or add wires. FIG. 5 illustrates the response to movement of element R1 away from wire W0 and into contact with element R0 in the implicit connection mode. The other connection that existed between the ports of wire W0 and element R1 is broken. The other connection between elements R1 and R0 is created, and the connection is recognized as a separate circuit model and net N2.

It should be appreciated from FIG. 3 that because of the explicit connections that are created whenever a connection is made in either mode, the connectivity data of the circuit model has the same format regardless of the connection mode used for making or substantially modifying a connection.

Figure 6B:
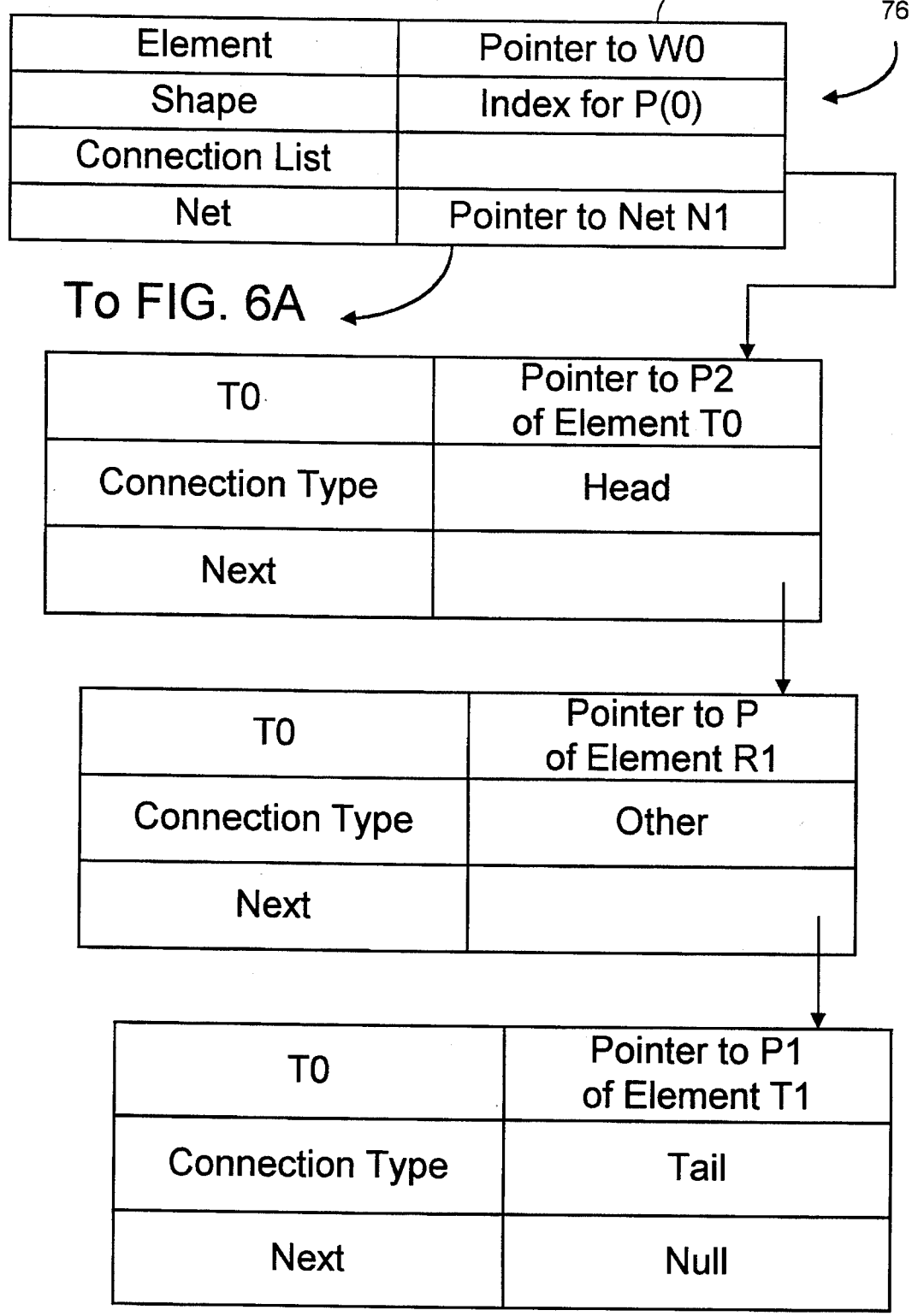
Figure 6C:
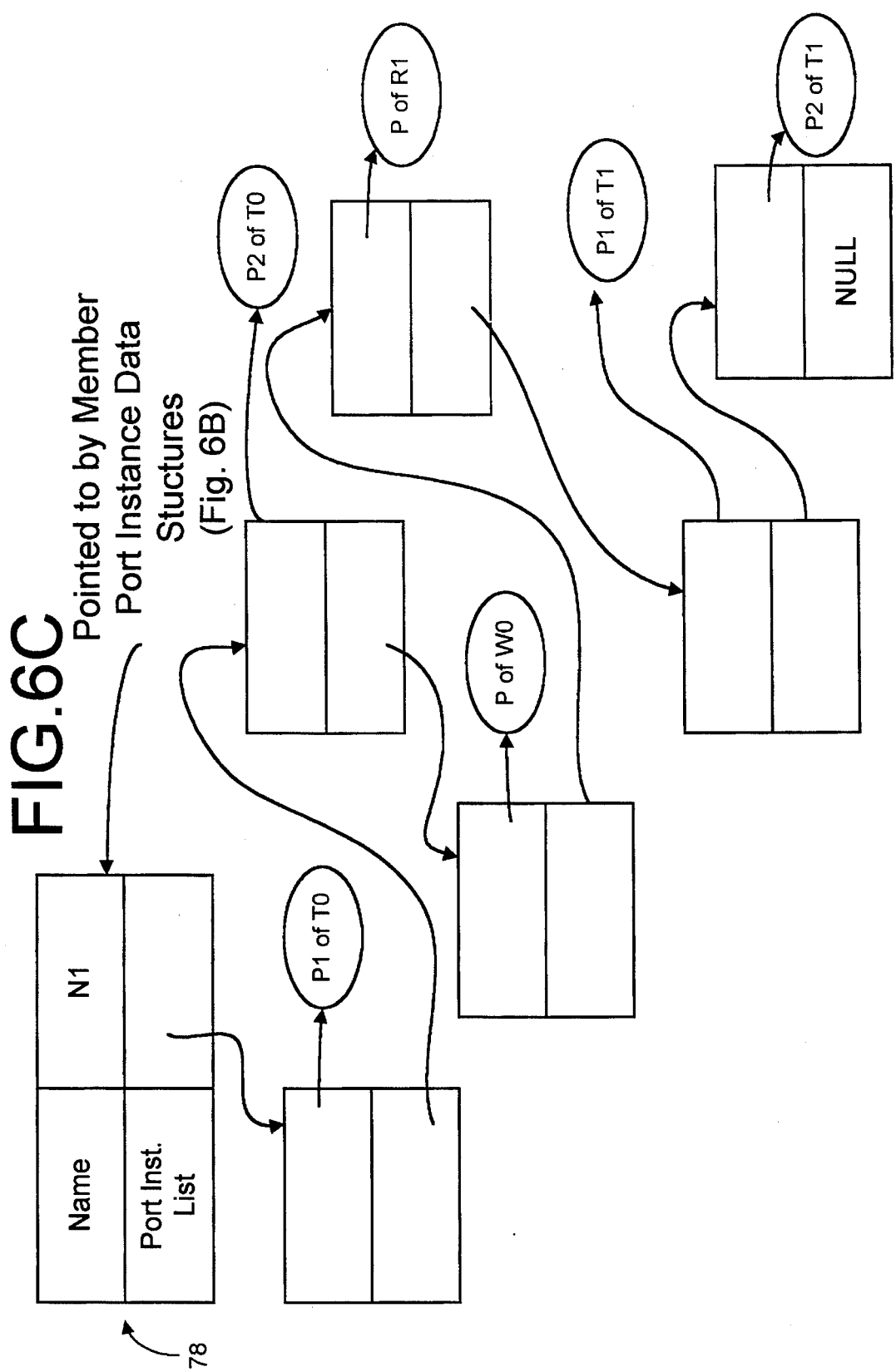

FIGS. 6A–C show examples of the various data structures within the design database 54 for storing data on a circuit model and associated mask geometries of a design in accordance with the invention. These data structures are created in the process of creating and editing a circuit design. FIG. 6A is a visual representation of two element data structures, wire W0 and transistor T0. FIG. 6B is a visual representation of port instance data structure P of wire W0 (FIG. 3). FIG. 6C is a visual representation of the net data structure for the elements of net N1.

The element data structures in FIG. 6A are created by the database manager 44 when the editor 42 adds the element to a layout and are stored in design database 54. An element data structure, such as the transistor data structure 72 or wire data structure 74, includes the element's name, its attribute count, and its attribute array. Attributes of an element are its significant geometric parts. Element T0 has five attributes: four port instances and the gate area. Each attribute of this element has four fields: name, shape, layer and tag. The name field stores the attribute name. The shape field stores the attribute coordinates, such as the four corners for a rectangle. The layer field stores the type of material for the attribute, such as polysilicon or diffusion. The tag field stores the nature of the attribute: a port or a geometric area. The data in this structure is used for determining whether electrical connections can be made between each geometric piece that comprises the element and other circuit elements. For example, polysilicon and diffusion layers make electrical connections only with like layers. Port P1 of transistor T0, therefore, can only make an electrical connection with ports of the same material, such as port P2 on transistor T0 or P on wire W0 (see the layer entry in data structure 74).

As electrical connections are made between circuit elements in either mode, port instance data structures such as data structure 76 in FIG. 6B are created by the database manager 44 and stored in design database 54. Note that in FIG. 3 port instance P of wire W0 is connected to P2 of transistor T0, to P of element R1 and to P1 of transistor T1. Data structure 76 stores a pointer to the name of the element with which the port is associated, (here, W0) an index into the shape attribute of the port instance, a connection list of port instances to which this port instance connects, and a pointer to the net in which the port instance is connected (here, net N1). The connection list is a linked list of connection data structures that store a pointer to the connected port instance and the type of electrical connection. With the information in data structure 76, apparatus 41 has a record of the types of connections between the various circuit elements that comprise a particular circuit model such as net N1. The data in data structure 76 is used by apparatus 41 to add, delete or modify wires within the net in response to the addition of new circuit elements or the modification of the existing topology in either connection mode of operation.

FIG. 6C shows an example of a net data structure 78 for the net N1 of FIG. 3. This data structure is created by the database manager 44 and stored in the design database 54 whenever a user forms a net by connecting two or more circuit elements. Data structure 78 stores the name of the net, which is pointed to by the port instance data structures related to it, and a list of the port instances. This list is a single linked list of the port instances.

Using the data structures described above, apparatus 41 is able to provide a user with both explicit and implicit connection modes of operation. The connectivity data generated in either mode is stored in a single format. Modifications can easily be made to a circuit design in either mode since the data is compatible with both modes of operation.

Having illustrated and described the principles of the invention in a preferred embodiment, it should be apparent to those skilled in the art that the embodiment can be modified in arrangement and detail without departing from such principles. For example, different but equivalent data structures could, of course, be used to store the connectivity data in the design database. In view of the many possible embodiments to which the principles of our invention may be applied, it should be recognized that the illustrated embodiment is only a preferred example of the invention and should not be taken as a limitation on the scope of the invention. Rather, the invention is defined by the following claims. We therefore claim as our invention all that comes within the scope and spirit of these claims.

We claim:

1. An integrated circuit design apparatus, comprising:
    editing means for entering and modifying in memory circuit elements of an integrated circuit layout;
    an implicit connection generator for automatically extracting electrical connections between the circuit elements in the layout, the generator representing the electrical connections by connectivity data, the implicit connection generator for connecting overlapping circuit elements;
    an explicit wiring generator for creating electrical connections between the circuit elements in response to user commands, the generator representing the electrical connections by connectivity data, the explicit wiring generator for connecting circuit elements and preserving the connection regardless of whether the circuit elements overlap; and
    a design database contained in memory for storing connectivity data from the implicit and explicit wire generators as a circuit model of the integrated circuit layout.

2. The apparatus of claim 1 wherein the implicit connection generator is adapted to break the connection between circuit elements that are moved to not overlap.

3. The apparatus of claim 1 wherein the editing means is responsive to user commands from a keyboard.

4. The apparatus of claim 1 wherein the editing means is responsive to user commands from a pointing device.

5. The apparatus of claim 1 including a connectivity mode switcher for switching between the implicit wire generator and the explicit wire generator.

6. The apparatus of claim 1 wherein the explicit connection data is type connection data indicating the type of connection between circuit elements.

7. A method of editing a layout of a circuit stored in a database contained in memory, the method comprising the following steps:
    providing a layout editor with explicit and implicit connection modes of operation for making electrical connections between circuit elements of a circuit layout;
    for each electrical connection made between circuit elements in either mode, storing explicit connection data in the design database;
    in response to editing of an electrical connection in the explicit wiring mode, using the explicit connection data to preserve the electrical connection regardless of geometrical overlapping of the circuit elements; and
    in response to editing of an electrical connection in the implicit connection mode, deleting the explicit connection data to break the connection.

8. The method of claim 7 wherein the explicit connection data is type connection data indicating the type of connection between circuit elements.

9. The method of claim 7 wherein the explicit connection data is type connection data indicating the type of connection between circuit elements, and using the explicit connection data to preserve the connection includes changing the dimensions of an existing wire element or adding a wire element, depending upon the type of connection.

10. The method of claim 7 wherein the implicit connection mode includes connecting overlapping circuit elements.

11. The method of claim 7 wherein the implicit connection mode includes disconnecting circuit elements that do not overlap.

12. A visual editor for editing and/or creating an integrated circuit design, comprising:
 a computer system having a user input device and a visual display, the computer system adapted to allow a user to select circuit elements to be displayed on the visual display;
 an implicit connection generator for interconnecting the selected circuit elements when the circuit elements overlap on the visual display and disconnecting the selected circuit elements when they do not overlap on the visual display; and
 an explicit wiring generator for interconnecting the selected circuit elements regardless of whether the circuit elements overlap on the visual display.

13. The visual editor of claim 12 whereby the user can switch between using the implicit connection generator and the explicit wiring generator.

* * * * *